(12) United States Patent
Millward et al.

(10) Patent No.: US 7,910,660 B2
(45) Date of Patent: Mar. 22, 2011

(54) ZWITTERIONIC BLOCK COPOLYMERS AND METHODS

(75) Inventors: Dan B. Millward, Boise, ID (US); Eugene P. Marsh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/760,860

(22) Filed: Apr. 15, 2010

(65) Prior Publication Data
US 2010/0204402 A1     Aug. 12, 2010

Related U.S. Application Data

(62) Division of application No. 11/897,593, filed on Aug. 31, 2007, now Pat. No. 7,732,533.

(51) Int. Cl.
    *C08F 293/00* (2006.01)
(52) U.S. Cl. ........ 525/267; 525/280; 525/268; 525/269; 525/270; 525/271
(58) Field of Classification Search .................. 525/280, 525/267, 268, 269, 270, 271
See application file for complete search history.

(56) References Cited

U.S. PATENT DOCUMENTS

| | | |
|---|---|---|
| 6,632,895 B1 | 10/2003 | Melchiors et al. |
| 6,686,424 B2 | 2/2004 | Detrembleur et al. |
| 6,746,825 B2 | 6/2004 | Nealey et al. |
| 6,926,953 B2 | 8/2005 | Nealey et al. |
| 7,045,851 B2 | 5/2006 | Black et al. |
| 7,347,953 B2 | 3/2008 | Black et al. |
| 2003/0204022 A1 | 10/2003 | Kennedy et al. |
| 2004/0101621 A1 | 5/2004 | Adams et al. |
| 2004/0124092 A1 | 7/2004 | Black et al. |
| 2004/0142578 A1 | 7/2004 | Wiesner et al. |
| 2004/0256662 A1 | 12/2004 | Black et al. |
| 2005/0159556 A1 | 7/2005 | Lewis et al. |
| 2006/0134556 A1 | 6/2006 | Nealey et al. |
| 2006/0163646 A1 | 7/2006 | Black et al. |
| 2006/0249784 A1 | 11/2006 | Black et al. |
| 2008/0038467 A1 | 2/2008 | Jagannathan et al. |

OTHER PUBLICATIONS

Lowe et al. Chem. Rev. 2002, 102, 4177-4189.*
Gohy et al. Macromolecules 2000, 33, 6378-6387.*
International Search Report and Written Opinion from PCT/US2008071916 (19 pgs.).
Kong et al., "Amphiphilic Polymer Brushes Grown from the Silicon Surface by Atom Transfer Radical Polymerization," Macromolecules 2001, 34:1837-1844.
Dourges et al. Macromolecules 1999, 32, 2495-2502.
Annex to Form PCT/ISA/206 Communication Relating to the Results of the Partial International Search Report for related PCT/US2008/071916 (3 pgs.).

(Continued)

*Primary Examiner* — Vasu Jagannathan
*Assistant Examiner* — Mark S Kaucher
(74) *Attorney, Agent, or Firm* — Wells St. John P.S.

(57) ABSTRACT

Zwitterionic block copolymers having oppositely charged or chargeable terminal groups, and methods of making and using the same, are disclosed. The zwitterionic block copolymers can undergo microphase separation. In some embodiments a zwitterionic block copolymer includes a first terminal block having a positively charged or chargeable group at a terminal end, and a second terminal block having a negatively charged or chargeable group at another terminal end. The zwitterionic block copolymer is configured to undergo microphase separation to assemble into alternating lamellar domains; with one of the alternating domains being composed of the first terminal block, and with another of the alternating domains being composed of the second terminal block.

6 Claims, 1 Drawing Sheet

OTHER PUBLICATIONS

Ayres et al., "Stimuli-Responsive Surfaces Using Polyampholyte Polymer Brushes Prepared via Atom Transfer Radical Polymerization," Langmuir, Mar. 27, 2007; 23:3744-3749.

Ayres et al., "Stimuli-Responsive Polyelectrolyte Polymer Brushes prepared via Atom-Transfer Radical Polymerization," Langmuir, Jan. 2, 2007; 23:182-189.

Lowe et al., "Synthesis and Characterization of Zwitterionic Block Copolymers," Macromolecules, Sep. 8, 1998; 5991-5998.

Xin et al., "Synthesis of zwitterionic block copolymers via RAFT polymerization," Euro Polymer J., Jul. 1, 2005; 41:1539-1545.

Nederberg et al. Polymeric Materials: Science & Engineering 2006, 95, 673.

Black et al., "Nano-meter scale pattern registration and alignment by directed diblock copolymer self-assembly," IEEE Transaction on Nanotechnology, Sep. 2004;3(3):412-415.

Black, C.T., "Self-aligned self assembly of multi-nanowire silicon field effect transistors," Applied Physics Letters, Oct. 17, 2005;87(16):163116-1 to 163116-3.

Rebecca Braslau [online]. UC Santa Cruz Chemistry and Biochemistry. Available Mar. 23, 2007. [retrieved on Apr. 25, 2007]. Retrieved from the Internet<URL:http://www.chemistry.usc.edu/faculty/braslau.html>; 5 pgs.

Bucknall, David G., "Anomalous Concentration Effects of Zwitterionic Telechelic Polymer Solutions in Electric Fields," Macromol Chem Phys, Jan. 2002;203(1):89-99.

Floudas et al., "Statics and Dynamics of w-Functionalized Block Copolymers of Styrene and Isoprene," Macromolecules, Jul. 3, 1995;28(14):5109-5118.

Hadjichristidis et al., "Block Copolymers with strongly interacting groups," Block Copolymers, Synthetic Strategies, Physical Properties, and Applications, Chapter 18, Wiley-Interscience, Hoboken, NJ, 2003:335-345.

Henn et al., "Chain End Effects and Dewetting in Thin Polymer Films," Macromolecules, Jun. 3, 1996;29 (12):4305-4313.

Huang et al., "Computer simulation on the self-assembly of associating polymers," Polymer, Mar. 2003;44 (6):1967-1972.

Karim et al., "Control of Ordering Kinestics and Morphology using Zone Annealing of Thin Block Copolymer Films," Abstract submitted for the MAR07 Meeting of the American Physical Society, Nov. 20, 2006; 1 pg.

Lowe et al., "Synthesis and aqueous solution properties of novel zwitterionic block copolymers," Chem Commun., 1997:1035-1036.

Mendes et al., "Zwitterionic and monofunctional block copolymers in a selective solvent: Model macromolecular surfactants," Progr Colloid Polym Sci, 1998;110:220-224.

Nedelcheva et al., "Electrostatic self-assembly of thermally responsive zwitterionic poly (N-isopropylacrylamide) and poly(ethylene oxide) modified with ionic groups," Polymer, 2005;46:2059-2067. (Available online Jan. 25, 2005).

Park et al., "Directed Assembly of Lamellae-Forming Block Copolymers Using Chemically and Topographically Patterned Substrates" Advanced Materials, Feb. 2007;19(4):607-611. (Published online Jan. 26, 2007).

Pispas et al., "Block Copolymers with Zwitterionic Groups at Specific Sites: Synthesis and Aggregation Behavior in Dilute Solutions," Journal of Polymer Science, Oct. 15, 2000;38(20):3791-3801.

Ruiz et al., "Induced Orientational Order in Symmetric Diblock Copolymer Thin Films" Advanced Materials, Feb. 2007;19(4):587-591. (Published online Jan. 25, 2007).

Tang et al., "Orientation of Microdomains of Block Copolymers by Zone casting," Abstract submitted for the MAR07 Meeting of the American Physical Society, Dec. 3, 2006;1 pg.

Wang et al., "The Alignment of Ion-Complexed Symmetric Diblock Copolymer Thin Films under an Electric Field," Abstract submitted for the MAR07 Meeting of the American Physical Society, Nov. 14, 2006; 1 pg.

Yamaguchi et al., "Resist-Pattern Guided Self-assembly of Symmetric Diblock Copolymer," J of Photopolymer Science and Technology, 2006;19(3):385-388.

Yurt et al., "Scission of Diblock Copolymers into Their Constituent Blocks," Macromolecules, 2006;39(5):1670-1672. (Published online Feb. 2, 2006).

Yurt et al., "Scission of Diblock Copolymers into Their Constituent Blocks," Macromolecules, 2006;Supporting Information: S1-S7.

"Zwitterionic Polymers," Oxford Materials, Polymers and Bio-Materials Group, [online]. [retrieved on Apr. 25, 2007]. Retrieved from the Internet:<URL:http://users.ox.ac.uk/~dgbuck/people/bucknall/research/zwitterion.htm>; 2 pgs.

\* cited by examiner

ZWITTERIONIC BLOCK COPOLYMERS AND METHODS

RELATED PATENT DATA

This patent resulted from a divisional of U.S. patent application Ser. No. 11/897,593, which was filed Aug. 31, 2007, now U.S. Pat. No. 7,732,533 and which is hereby incorporated herein by reference.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. An increase in the performance and density of memory devices is needed, for example, as the performance of computer systems increases. In certain instances, transistors have been reduced in size to accomplish density and performance increases, also resulting in increased speed with decreased power requirements. However, further reductions in size are often limited by the lower limit of dimensions that can be achieved using lithographic methods. Electron beam (e-beam) lithography and extreme ultraviolet (EUV) lithography have been used in attempts to prepare smaller features than are available using conventional lithographic methods. Although such methods can be capable of preparing smaller features, widespread use of such methods has been hampered by difficulties including, for example, high costs and/or incompatibility with high throughput production methods.

Self-assembly of block copolymers has also been used to prepare small features. For example, block copolymers, upon annealing, can undergo microphase separation to minimize contact between unlike domains. For example, the polymer molecules in an A-B block copolymer can be arranged in a head-to-head and tail-to-tail arrangement (e.g., A-B:B-A:A-B:B-A) to minimize contact between A and B blocks. As a result, regular patterns can be formed having the domain width (i.e., width of A:A or B:B, which is the average coil length of A:A or B:B) as the controlling feature size. Because at least some minimum average coil length or molecular weight for each block (A or B) is required to drive microphase separation, it becomes impractical to attempt to reduce feature size by reducing coil length or molecular weight for one or more of the blocks. For these as well as other reasons (e.g., blurring at the interface), patterns formed by self-assembly of block copolymers are practically limited to those having a domain width of at least 5 nanometers, with typical domain widths being substantially larger.

For the reasons stated above, and for other reasons stated below which will become apparent to those skilled in the art upon reading and understanding the present specification, there is a need in the art for new methods for preparing small features.

DETAILED DESCRIPTION OF ILLUSTRATIVE EMBODIMENTS

Figure 1:
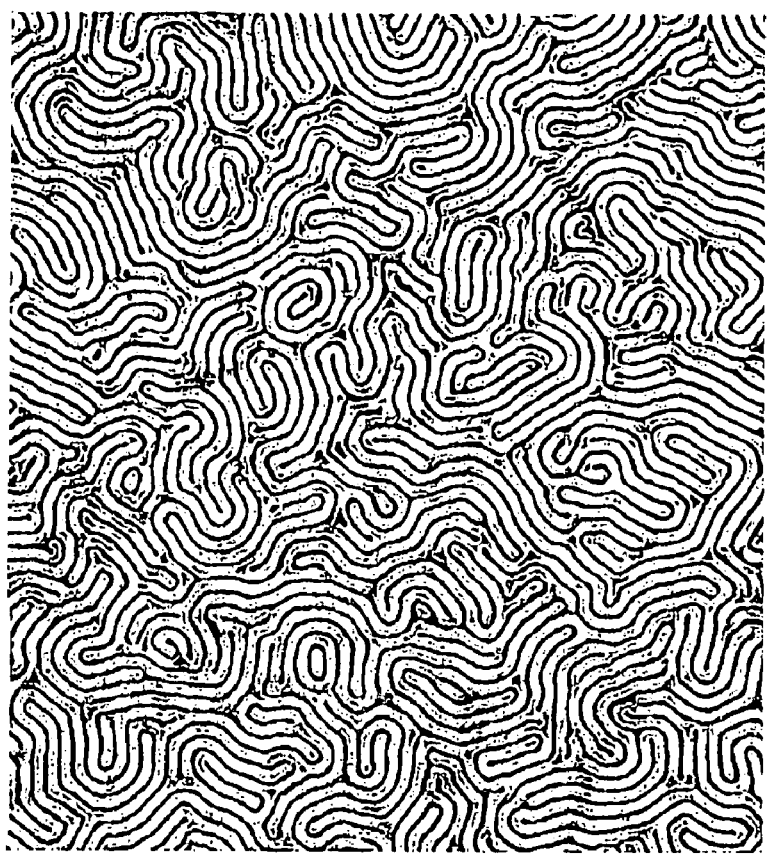
FIG. 1 is an illustration of a patterned surface that can be formed by assembled zwitterionic block copolymers having oppositely charged or chargeable terminal groups lacking long range order.

Zwitterionic block copolymers having oppositely charged or chargeable terminal groups are disclosed herein. For example, zwitterionic diblock copolymers having oppositely charged terminal groups can be represented by the formula $^+$A-B$^-$. Such zwitterionic block copolymers having oppositely charged terminal groups can undergo microphase separation, for example, upon annealing and/or upon application of an electric field. Coulombic interactions strongly disfavor the conventional head-to-head and tail-to-tail arrangement discussed above, because such an arrangement would place like charged terminal groups (e.g., A$^+$ and A$^+$) in close proximity. In contrast, zwitterionic block copolymers having oppositely charged end groups are believed to undergo microphase separation, upon annealing, to minimize contact between like charged end groups. For example, the polymer molecules in an $^+$A-B$^-$ block copolymer can be arranged in a head-to-tail arrangement (e.g., $^+$A-B$^-$:$^+$A-B$^-$:$^+$A-B$^-$) to minimize contact between blocks with like charge (e.g., A$^+$:$^+$A and B$^-$:$^-$B interactions). In certain embodiments the zwitterionic block copolymers can assemble faster and/or result in sharper interfaces in comparison with conventional assembled block copolymers.

Advantageously, zwitterionic block copolymers having oppositely charged terminal groups (e.g., $^+$A-B$^-$ block copolymers) that undergo microphase separation (e.g., upon annealing and/or application of an electric field) to result in a head-to-tail arrangement (e.g., $^+$A-B$^-$:$^+$A-B$^-$:$^+$A-B$^-$) can form regular patterns having the domain width (i.e., width of A or B, which is the average coil length of A or B) as the controlling feature size. Thus, the domain width in the head-to-tail arrangement (i.e., the width of A or B) is effectively one half the domain width encountered in the conventional head-to-head and tail-to-tail arrangement (i.e., width of A:A or B:B), which allows for the formation of features with smaller sizes than are available from the conventional self-assembly of diblock copolymers.

As used herein, "a," "an," "the," and "at least one" are used interchangeably and mean one or more than one.

As used herein, the term "or" is generally employed in the sense as including "and/or" unless the context of the usage clearly indicates otherwise.

Also herein, the recitations of numerical ranges by endpoints include all numbers subsumed within that range (e.g., 1 to 5 includes 1, 1.5, 2, 2.75, 3, 3.80, 4, 5, etc.).

As used herein, the term "comprising," which is synonymous with "including" or "containing," is inclusive, open-ended, and does not exclude additional unrecited elements or method steps.

The above brief description of various embodiments disclosed herein is not intended to describe each embodiment or every implementation of such methods. Rather, a more complete understanding of the methods as described herein will become apparent and appreciated by reference to the following description and claims in view of the accompanying drawing. Further, it is to be understood that other embodiments may be utilized and structural changes may be made without departing from the scope of the present disclosure.

The zwitterionic block copolymers that are disclosed herein are copolymers that include: a first terminal block having a positively charged or chargeable group at the terminal end thereof; and a second terminal block having a negatively charged or chargeable group at the terminal end thereof. For some embodiments, the copolymer is a diblock copolymer having the non-terminal end of the first terminal block covalently attached to the non-terminal end of the second terminal block. For some other embodiments, the copolymer is a multi-block copolymer further including one or more covalently attached additional blocks having at least a first end and a second end, wherein the non-terminal end of the first terminal block is covalently attached to the first end of the one or more additional blocks, and the non-terminal end of the second terminal block is covalently attached to the second end of the one or more additional blocks.

The zwitterionic block copolymers disclosed herein have oppositely charged or chargeable terminal groups. As used herein, the term "charged" means that the group bears a formal charge, and the term "chargeable" means that the group is capable of being modified so as to bear a formal charge through an association or dissociation of a species, which most often involves association or dissociation of a proton (e.g., protonation or deprotonation) or a counterion (association or dissociation of a salt). For example, an amine group is chargeable, and the protonated amine is charged. Similarly, a carboxylic acid group is chargeable, and the deprotonated carboxylate group is charged. Typically one terminal group will have a +1 formal charge and the other terminal group will have a −1 formal charge, although the terminal groups can also have higher formal charges (e.g., +2, −2 and +3, −3). As used herein, a "terminal" charged or chargeable group is intended to refer to a group that is at a terminus of the copolymer chain or sufficiently near a terminus of the copolymer chain to effectively influence assembly of the copolymer upon annealing.

Optionally the zwitterionic copolymers disclosed herein can further include, for example, a non-terminal zwitterionic group (i.e., a non-terminal group formally having both positive and negative charges). Typically and conveniently, the optional non-terminal zwitterionic group can be located between blocks of the block copolymer. Zwitterionic groups include, for example, betaines such as sulfobetaines, phosphobetaines, aminocarboxylic acids, aminosulfonic acids, and combinations thereof.

The block copolymers described herein are polymers that include one or more long sequences (i.e., "blocks") of the same monomeric unit(s) covalently bound to one or more long sequences (i.e., "blocks") of unlike type, e.g., including differing monomeric unit(s). Block copolymers are typically named using the word "-block-" or a "-b-" to separate each monomeric unit, while random copolymers are typically named using the word "-random-" or an "-r-" to separate each monomeric unit. The block copolymers disclosed herein include a wide variety of block copolymers. For example, the block copolymers disclosed herein can include diblock copolymers (i.e., copolymers having two blocks), triblock copolymers (i.e., copolymers having three blocks), multi-block copolymers (i.e., copolymers having more than three blocks), and combinations thereof Each block of a block copolymer can assemble into a domain during self-assembly. For example, substantially symmetric diblock copolymers can self-assemble into lamellar structures in which alternating lamellae each represent a domain that includes one block of the diblock copolymer. Further, the distance between the middle of a first lamella and the middle of the next lamella of the same type is the inherent periodicity ("$L_o$"), which can be dependent on the length and/or molecular weight of the polymer chain for each block. Thus, the inherent periodicity can be increased by increasing the length and/or molecular weight of the polymer chain for one or both blocks of a diblock copolymer. Similarly, the inherent periodicity can be decreased by decreasing the length and/or molecular weight of the polymer chain for one or both blocks of a diblock copolymer. Diblock copolymers as described herein typically have an inherent periodicity ($L_o$) of from 10 nanometers to 100 nanometers.

For certain embodiments, each block of a block copolymer as described herein can differ from other blocks in the copolymer not only in terms of the structure of monomeric units that form the block, but also in other properties including, for example, physical properties (e.g., mechanical strength, surface tension, wettability, and/or solubility) and chemical properties (e.g., solubility, chemical reactivity, susceptibility to removal techniques, and/or susceptibility to crosslinking reactions). For some embodiments, a block can include a small portion (e.g., 5 mole % or less) of units formed from crosslinkable monomers. In certain embodiments, the non-crosslinkable and crosslinkable units can have similar physical and chemical properties.

Example diblock copolymers include polystyrene-b-polymethylmethacrylate block copolymers, polyethyleneoxide-b-polyisoprene block copolymers, polyethyleneoxide-b-polybutadiene block copolymers, polyethyleneoxide-b-polystyrene block copolymers, polyethyleneoxide-b-polymethylmethacrylate block copolymers, polystyrene-b-polyvinylpyridine block copolymers, polystyrene-b-polyisoprene block copolymers, polystyrene-b-polybutadiene block copolymers, polybutadiene-b-polyvinylpyridine block copolymers, polyisoprene-b-polymethylmethacrylate block copolymers, and combinations thereof. A typical example is a polystyrene-b-polymethylmethacrylate diblock copolymer.

Example triblock and/or multiblock copolymers include block copolymers having three or more blocks selected from the group consisting of polystyrenes, polyalkyl(meth)acrylates (e.g., polymethylmethacrylate), polyalkyleneoxides (e.g., polyethyleneoxide), polyolefins (e.g., polyethylene, polypropylene), polydienes (e.g., polyisoprene and polybutadiene), polyvinylpyridines, and combinations thereof. As used herein, the term "(meth)acrylate" is a shorthand reference to acrylate, methacrylate, or combinations thereof.

Methods of making zwitterionic block copolymers are also disclosed herein. A wide variety of methods can be used for making zwitterionic block copolymers provided that they result in copolymers having oppositely charged or chargeable terminal groups. Living polymerization methods are particularly useful for making such zwitterionic block copolymers. Examples of living polymerization methods include living cationic polymerization, ring opening metathesis polymerization, group transfer polymerization, anionic living polymerization, free radical living polymerization (also known as controlled radical polymerization), and living Ziegler-Natta polymerization. Free radical living polymerization can advantageously used to polymerize a wide variety of free radically-polymerizable monomers.

A wide variety of free radical living polymerization methods can be used to prepare zwitterionic block copolymers as disclosed herein. Example free radical living polymerization methods include, but are not limited to, catalytic chain transfer polymerization, iniferters, stable free radical mediated polymerization, atom transfer radical polymerization, reversible addition fragmentation chain transfer polymerization, iodine-transfer polymerization, selenium-centered radical-mediated polymerization, telluride-mediated polymerization, and stibine-mediated polymerization. An example of stable free radical mediated polymerization is nitroxide mediated polymerization which can be conducted using, for example, alkoxyamine initiators.

For some embodiments, such methods include: combining a living polymerization initiator having a charged or chargeable group (or a group that can be converted to a charged or chargeable group post-polymerization) with a first monomer under conditions effective to form a polymer including a first block having attached to the non-living end of the block at least the portion of the initiator having the charged or chargeable group; combining the polymer with a second monomer under conditions effective to form a second block of a block copolymer; and combining the copolymer with a third monomer under conditions effective to complete the copolymer with the third monomer, wherein the third monomer has an oppositely charged or chargeable group (or a group that can be converted to an oppositely charged or chargeable group post-polymerization), compared to the charged or chargeable group of the initiator. In certain embodiments the living polymerization initiator is a living free radical polymerization initiator such as an initiator for nitroxyl-mediated polymerization (e.g., an alkoxyamine).

The alkoxyamine used as an initiator for nitroxyl-mediated polymerization can have a charged or chargeable group, typically attached to the fragment that dissociates from the nitroxyl-fragment, and that serves to initiate polymerization of the desired monomers. The alkoxyamine can be, for example, of the formula:

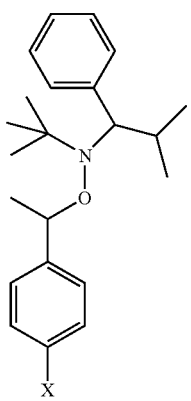

Formula I wherein X is a charged or chargeable group. For example, X can represent positively charged or chargeable groups including amine groups such as a (dimethylamino)methyl group. Alternatively, X can represent a group that can be converted to a charged or chargeable group post-polymerization (e.g., a halomethyl group that can be reacted with a dialkylamine post-polymerization to form a charged or chargeable amino group).

Conditions effective to polymerize a monomer with the alkoxyamine initiator can readily be determined by one of skill in the art, and will vary depending on the specific initiator and monomer employed. Generally, conditions effective to cause polymerization include combining a monomer and an initiator in one or more organic solvents (e.g., an aprotic solvent such as toluene), which are preferably substantially free of oxygen and water, and allowing the reaction to proceed (optionally under an inert atmosphere) until the monomer is substantially consumed. A second monomer can then be added to extend the polymer chain and/or form a second block. In some embodiments, the reaction mixture may be heated to a temperature (e.g., up to the boiling point of the solvent, or even higher if the reaction is conducted under pressure) to increase the rate of reaction.

A wide variety of free radically-polymerizable monomers can be used to make each block of the copolymer. Example monomers include, but are not limited to, ethylene, propylene, styrene, methyl(meth)acrylate, ethyl(meth)acrylate, butyl(meth)acrylate, butadiene, isoprene, vinylpyridine, vinylesters, and combinations thereof. Sufficient amounts of monomer can be sequentially provided to produce the desired block length for each block of the copolymer.

The copolymer can then be completed by combining the copolymer with a third monomer under conditions effective to complete the copolymer with the third monomer. The third monomer has an oppositely charged or chargeable group (or a group that can be converted to an oppositely charged or chargeable group post-polymerization), compared to the charged or chargeable group of the initiator. For example, when the initiator has a positively charged or chargeable group, the third monomer can have a negatively charged or chargeable group (e.g., a carboxylic acid group). Examples of monomers having a negatively charged or chargeable group include, but are not limited to, alkenoic acids such as acrylic acid, methacrylic acid, and combinations thereof.

In certain embodiments, methods for assembling block copolymers are disclosed herein. Such methods can include: providing a zwitterionic block copolymer including: a first terminal block having a positively charged or chargeable group at the terminal end thereof; and a second terminal block having a negatively charged or chargeable group at the terminal end thereof; and annealing the zwitterionic block copolymer. Other such methods can include: providing a zwitterionic block copolymer including: a first terminal block having a positively charged or chargeable group at the terminal end thereof; and a second terminal block having a negatively charged or chargeable group at the terminal end thereof; and applying an electric field to the zwitterionic block copolymer.

Useful annealing methods include thermal annealing, zone annealing, solvent annealing, and combinations thereof. Annealing can include exposing the block copolymer to a temperature of from 0° C. to 250° C. for up to 24 hours or longer, and in certain embodiments under a vacuum and/or an oxygen-free atmosphere. Thermal annealing typically includes exposing the block copolymer to an elevated temperature (e.g., at or above the glass transition temperature), and lowering the temperature to allow the self-assembled block copolymer to harden. Zone annealing typically includes a moving hot-cold temperature gradient zone, with hot being below the order-disorder transition temperature but above the glass transition temperature. Solvent annealing can include exposing the block copolymer to vapors of a solvent that solvates each block of the block copolymer; allowing the block copolymer to swell (and in certain embodiments become plasticized); and then removing at least a portion of the solvent, for example, through evaporation (and in certain embodiments allowing plasticizer to separate as the blocks phase separate, and removing at least a portion of the separated plasticizer).

Zwitterionic block copolymers having oppositely charged end groups can undergo microphase separation (e.g., upon annealing and/or application of an electric field) to minimize contact between like charged end groups. For example, the polymer molecules in an $^+$A-B$^-$ block copolymer can be arranged in a head-to-tail arrangement (e.g., $^+$A-B$^-$:$^+$A-B$^-$:$^+$A-B$^-$) to minimize contact between blocks with like charge (e.g., A$^+$:$^+$A and B$^-$:$^-$B interactions). Optionally, an electric field can be applied during at least a portion of the assembly process, for example, to accelerate the assembly method, to allow assembly under less stringent annealing conditions (e.g., zone annealing), and/or to enhance the ordering in the self-assembled structure. Optionally, the block copolymer can be treated with a vapor (e.g., an acidic or basic vapor) during at least a portion of the assembly process, for example, to influence the rate of assembly and/or the nature of the assembled copolymer. In certain embodiments the assembled domains of the zwitterionic block copolymer form lamellae.

In other certain embodiments, methods for patterning substrates are disclosed herein. For some embodiments, such methods can include: depositing a zwitterionic block copolymer on a substrate surface and annealing the deposited zwitterionic block copolymer, which can form an assembled block copolymer structure (e.g., lamellae). The zwitterionic copolymer can include: a first terminal block having a positively charged or chargeable group at the terminal end thereof; and a second terminal block having a negatively charged or chargeable group at the terminal end thereof. Optionally, the method can further include selectively crosslinking the first terminal block or the second terminal block of the assembled block copolymer structure. Optionally, the method can further include selectively removing one block (e.g., an uncrosslinked block) of the annealed, deposited zwitterionic block copolymer.

Self-assembly of block copolymers has been used to prepare features on substrates. See, for example, U.S. Pat. No. 7,045,851 B2 (Black et al.); U.S. Pat. Application Pub. Nos. 2004/0124092 A1 (Black et al.), 2004/0142578 A1 (Wiesner et al.), 2006/0134556 A1 (Nealey et al.), 2006/0163646 A1 (Black et al.), and 2006/0249784 A1 (Black et al.); Black, *IEEE Transactions on Nanotechnology*, 3:412-415 (2004); Black, *Applied Physics Letters*, 87: 163116, 1-3 (2005); and Yamaguchi et al., *Journal of Photopolymer Science and Technology*, 19:385-388 (2006).

Advantageously, zwitterionic block copolymers having oppositely charged terminal groups (e.g., $^+$A-B$^-$ block copolymers) that undergo microphase separation, upon annealing, to result in a head-to-tail arrangement (e.g., $^+$A-B$^-$:$^+$A-B$^-$:$^+$A-B$^-$) can form regular patterns having the domain width (i.e., width of A or B, which is the average coil length of A or B) as the controlling feature size. Thus, the domain width in the head-to-tail arrangement (i.e., the width of A or B) is effectively one half the domain width encountered in the conventional head-to-head and tail-to-tail arrangement (i.e., width of A:A or B:B), which allows for the formation of features with smaller sizes than are available from the conventional self-assembly of diblock copolymers.

The zwitterionic block copolymers can be deposited on a surface (e.g., a substrate surface) by methods that are well known to one of skill in the art. As used herein, "deposited on" a surface is intended to be broadly interpreted to include any suitable means of applying the block copolymer to the surface including, for example, deposition methods, coating methods, transfer methods, and/or other available application methods. Example deposition methods include, but are not limited to, spin coating, dip coating, spray coating, and combinations thereof. In such methods, the block copolymer can typically be dissolved, dispersed, or suspended in a medium (e.g., a solvent); the solution, dispersion, or suspension can be deposited on the surface, and the medium can optionally be removed (e.g., through evaporation at ambient or elevated temperature, and at ambient or reduced pressure) during or subsequent to deposition.

The substrate can optionally be a semiconductor substrate or substrate assembly. "Semiconductor substrate" or "substrate assembly" as used herein refers to a semiconductor substrate such as a base semiconductor layer or a semiconductor substrate having one or more layers, structures, or regions formed thereon. A base semiconductor layer typically can be the lowest layer of silicon material on a wafer or a silicon layer deposited on another material, such as silicon on sapphire. When reference is made to a substrate assembly, various process steps may have been previously used to form or define regions, junctions, various structures or features, and openings such as transistors, active areas, diffusions, implanted regions, vias, contact openings, high aspect ratio openings, capacitor plates, barriers for capacitors, etc.

Figure 2:
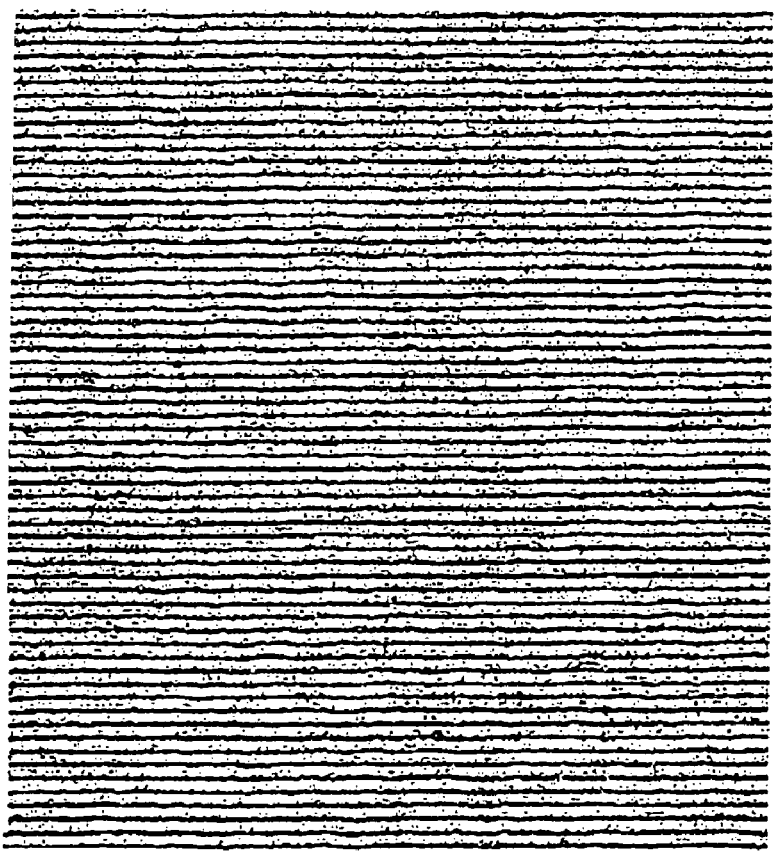
FIG. 2 is an illustration of a patterned surface that can be formed by assembled zwitterionic block copolymers having oppositely charged or chargeable terminal groups with long range order.

The zwitterionic block copolymer is typically deposited to a form a copolymer thickness of from 15 to 300 nanometers, although smaller or larger thicknesses can be employed as desired. Once the zwitterionic block copolymer has been deposited on a surface, the block copolymer can be annealed to break up any existing domains and to allow the block copolymer to self-assemble. In certain embodiments, the assembled domains of the zwitterionic block copolymer form lamellae that are oriented in a plane perpendicular to the surface of the substrate. Typically, the lamellae will lack long range and can form a pattern as illustrated in FIG. 1. Alternatively, surface guides and/or application of an external force can be used to provide long range order and can form a pattern as illustrated in FIG. 2.

For certain embodiments of zwitterionic block copolymers that assemble to form lamellae, a portion of the set of lamellae can optionally be selectively removed. In one example, the zwitterionic block copolymer can include a cleavable linkage between the blocks (e.g., a triphenylmethyl ether linkage that can be cleaved with acid as described, for example, in Yurt et al., *Macromolecules*, 39:1670-1672 (2006)). Following cleavage, lamellae that include one block can be selectively removed, for example, by treatment with a solvent capable of selectively removing (e.g., selectively solvating) the one block. In another example, a first portion of the set of lamellae can optionally be crosslinked and a second portion of the set of lamellae can optionally be selectively removed as described herein below.

For zwitterionic block copolymers that assemble to form lamellae, a first portion of the set of lamellae can optionally be crosslinked (e.g., by exposure to ultraviolet radiation), wherein the crosslinked lamellae include a first terminal block of the self-assembled block copolymer. Further, a second portion of the set of lamellae can optionally be selectively removed, wherein the removed lamellae include a second terminal block of the self-assembled block copolymer. The resulting structure can be used, for example, as an etch mask and/or a deposition mask. For example, in one embodiment the substrate surface can be etched using the crosslinked lamellae as an etch mask, any remaining polymeric material can optionally be removed, and conductive material (e.g., a metal-containing material, a conductive polymer, and/or a metal-containing polymer composite) can be deposited in the sub-lithographic trenches to form sub-lithographic conductive lines. In another embodiment, the substrate surface can be etched using the crosslinked lamellae as an etch mask, any remaining polymeric material can optionally be removed, and insulating material (e.g., non-conductive material having a high or low dielectric constant, and in certain embodiments a low dielectric constant to minimize capacitive coupling) can be deposited in the sub-lithographic trenches, for example, to isolate active areas from one another. As used herein, a high dielectric constant (high-k) material is considered to have a dielectric constant that is greater than that of silicon dioxide (i.e., k=3.9), and a low dielectric constant (low-k) material is considered to have a dielectric constant that is less than or equal to that of silicon dioxide (i.e., k=3.9). Alternatively, for embodiments in which the crosslinked lamellae are metal-containing lamellae, the resulting structure can include conductive lines. One or more additional layers can optionally be provided to form a device in which the conductive lines are, for example, transistor gates.

In certain embodiments, methods as disclosed herein can be used for sub-lithographic patterning of a substrate without the need for techniques such as interferometry, e-beam lithography, or EUV lithography, which can be expensive and/or unpractical for high throughput production methods. See, for example, U.S. Pat. No. 6,746,825 B2 (Nealey et al.) and U.S. Pat. No. 6,926,953 B2 (Nealey et al.).

As used herein, "metal-containing" is used to refer to a material, typically a compound or a layer that may consist entirely of a metal, or may include other elements in addition to a metal. Typical metal-containing compounds include, but are not limited to, metals, metal-ligand complexes, metal salts, organometallic compounds, and combinations thereof. Typical metal-containing layers include, but are not limited to, metals, metal oxides, metal silicates, and combinations thereof.

As used herein, "sublithographic" is used to refer to structures having one or more sizes or dimensions that are less than the minimum photolithography feature size. For example, "sublithographic lines" are used herein to refer to lines having a width of 57.5 nm or less.

In certain embodiments, lamellae that include a first block of the self-assembled block copolymer can optionally be crosslinked, for example, by exposure to radiation, e.g., ultraviolet (UV) radiation. In some embodiments, the block of the block copolymer being crosslinked can be susceptible to crosslinking without the addition of crosslinking agent. For example, if the block copolymer is a polystyrene-b-polymethylmethacrylate diblock copolymer, the polystyrene block can be crosslinked by exposure to UV radiation. For further examples, one block of the block copolymer can be made thermally crosslinkable by including a small amount (e.g., 0.1 to 5 mole %) of a thermally crosslinkable monomer (e.g., a benzocylobutane-containing monomer) and/or made photochemically crosslinkable by including a small amount (e.g., 0.1 to 5 mole %) of a photochemically crosslinkable monomer (e.g., divinyl benzene or azidomethylstyrene) in the block of the copolymer. In certain other examples, one block of the block copolymer can be made thermally and/or photochemically crosslinkable by including a small amount (e.g., 0.1 to 5 mole %) of a thermally and/or photochemically crosslinkable monomer (e.g., para-azidomethylstyrene). Alternatively, or in addition to, in some embodiments, crosslinking agents can be added to the lamellae that are to be crosslinked. A wide variety of crosslinking agents are known in the art and include, for example, the combination of a crosslinker (e.g., 1,3,5-trimethyl-2,4,6-(triacetoxymethyl) benzene) and a thermal acid generator (e.g., cyclohexylmethyl(2-oxocyclohexyl)sulfonium trifluoromethanesulfonate). Crosslinked lamellae can have, for example, improved mechanical properties and lower susceptibility to removal.

Remaining uncrosslinked lamellae can optionally be selectively removed, subsequent to crosslinking in certain embodiments, leaving the crosslinked lamellae on the surface. A wide variety of methods for removing uncrosslinked lamellae are known in the art including, for example, irradiation (e.g., UV or electron beam), ozone treatment, wet chemical processing methods such as immersion in a solvent, and/or etching methods such as reactive ion etching and ion beam etching. For example, when the block copolymer is a polystyrene-b-polymethylmethacrylate diblock copolymer and the lamellae including the polystyrene block are crosslinked, the remaining lamellae including the uncrosslinked polymethylmethacrylate block can be selectively removed, for example, by acetic acid development, and in certain embodiments after a blanket exposure to ultraviolet (UV) radiation.

Crosslinked lamellae can form openings to trenches. Thus, the resulting pattern including the crosslinked lamellae can be used, for example, as a deposition mask for depositing a material (e.g., a conductive or non-conductive material) on the substrate surface. Alternatively, or in addition to, crosslinked lamellae can be used, for example, as an etch mask for etching the surface of substrate in register with the openings to trenches as described above. For example, in one embodiment the substrate surface can be etched using the crosslinked lamellae as an etch mask, any remaining polymeric material can optionally be removed, and conductive material (e.g., a metal-containing material, a conductive polymer, and/or a metal-containing polymer composite) can be deposited in the sub-lithographic trenches to form sub-lithographic conductive lines. In another embodiment, the substrate surface can be etched using the crosslinked lamellae as an etch mask, any remaining polymeric material can optionally be removed, and insulating material (e.g., non-conductive material having a high or low dielectric constant, and in certain embodiments a low dielectric constant to minimize capacitative coupling) can be deposited in the sub-lithographic trenches, for example, to isolate active areas from one another. Alternatively, for embodiments in which the crosslinked lamellae are metal-containing lamellae, the resulting structure can include conductive lines. One or more additional layers can optionally be provided to form a device in which the conductive lines are, for example, transistor gates.

One or more additional layers can be deposited to form a device, for example, wherein sub-lithographic conductive lines as described herein can be transistor gates.

The following example is offered to further illustrate various specific embodiments and techniques of the present disclosure. It should be understood, however, that many variations and modifications understood by those of ordinary skill in the art may be made while remaining within the scope of the present disclosure. Therefore, the scope of the present disclosure is not intended to be limited by the following example.

EXAMPLES

A zwitterionic block copolymer having oppositely charged or chargeable terminal groups is prepared as follows. An alkoxyamine of Formula II (1 equivalent)

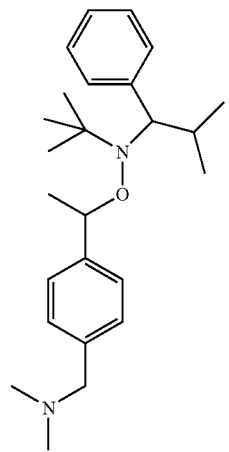

Formula II is used as an initiator for nitroxyl-mediated polymerization. Styrene (m equivalents) is added under conditions to form the first block of the block copolymer. Methyl methacrylate (n equivalents) is then added under conditions to form the second block of the block copolymer. Methacrylic acid (1 to 2 equivalents) is then added to form the terminal unit of the block copolymer to provide a block copolymer of the Formula III Formula III

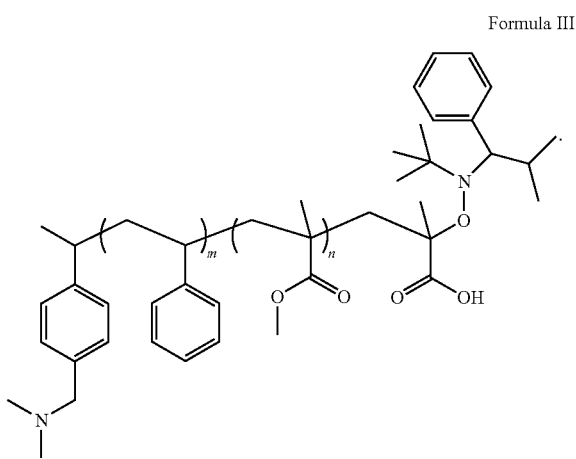

The complete disclosures of the patents, patent documents, and publications cited herein are incorporated by reference in their entirety as if each were individually incorporated. Various modifications and alterations to the embodiments described herein will become apparent to those skilled in the art without departing from the scope and spirit of the present disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

What is claimed is:

1. A zwitterionic block copolymer comprising:
   a first terminal block comprising an amine and/or a protonated amine group at the terminal end thereof; and
   a second terminal block comprising a carboxylic acid and/or a deprotonated carboxylic acid group at the terminal end thereof;
   wherein each of the first and second terminal blocks independently comprises polymerized monomers selected from the group consisting of ethylene, propylene, styrene, methyl(meth)acrylate, ethyl(meth)acrylate, butadiene, isoprene, and combinations thereof; and
   wherein the zwitterionic block copolymer assembles upon annealing.

2. The copolymer of claim 1 being a diblock copolymer having the non-terminal end of the first terminal block covalently attached to the non-terminal end of the second terminal block.

3. The copolymer of claim 1 being a multi-block copolymer further comprising one or more covalently attached additional blocks having at least a first end and a second end, wherein the non-terminal end of the first terminal block is covalently attached to a first end of one of said one or more additional blocks, and wherein the non-terminal end of the second terminal block is covalently attached to a second end of a block other than the first terminal block.

4. The copolymer of claim 1 further comprising a non-terminal zwitterionic group.

5. The copolymer of claim 4 wherein the zwitterionic group is a betaine.

6. The copolymer of claim 5 wherein the betaine is selected from the group consisting of sulfobetaines, phosphobetaines, aminocarboxylic acids, aminosulfonic acids, and combinations thereof.

* * * * *